FREQUENCY SWEEP CIRCUIT FOR MICROWAVE OSCILLATORS

INVENTOR.
HORACE R. JOHNSON,
BY
Henry Heyman
ATTORNEY.

INVENTOR.
HORACE R. JOHNSON,
BY
Henry Heyman
ATTORNEY.

2,820,901

FREQUENCY SWEEP CIRCUIT FOR MICROWAVE OSCILLATORS

Horace R. Johnson, Los Angeles, Calif., assignor to Hughes Aircraft Company, Culver City, Calif., a corporation of Delaware Application December 8, 1954, Serial No. 473,883

3 Claims. (Cl. 250—36)

This invention relates to microwave tubes and more particularly to a circuit for sweeping the oscillation frequency range of a traveling-wave tube oscillator of the backward-wave type.

Backward-wave oscillators are traveling-wave tube, voltage-tuned wave generators which have an unusually large electronic tuning range within the microwave frequency spectrum. Such an oscillator may be effectively employed in a number of wide-range, frequency-sweep type instruments such as reflectometers, spectrum analyzers and sweeping receivers. In a number of these oscillator applications it is desirable to sweep the frequency range of a tube linearly with time, that is, the rate of change of the frequency with respect to time should be constant. However, the frequency versus voltage characteristic tuning curve of a backward-wave oscillator itself is not linear. Consequently, it has become desirable to devise a non-linear voltage sweep circuit for a backward-wave oscillator which will give a substantially linear frequency sweep with respect to time.

It is therefore an object of the invention to provide a frequency sweep circuit for a backward-wave oscillator.

It is another object of the invention to provide a circuit which will give a substantially linear frequency sweep for a traveling-wave tube oscillator.

In accordance with the invention a circuit using parallel resistance and reactance is provided with two direct-current voltage supplies. A transient voltage is then derived from the circuit, the transient voltage being impressed on a traveling-wave tube slow-wave structure, whereby the oscillation frequency of the traveling-wave tube is decreased from a certain maximum value substantially linearly with time.

The novel features which are believed to be characteristic of the invention, both as to its organization and method of operation, together with further objects and advantages thereof, will be better understood from the following description considered in connection with the accompanying drawings in which several embodiments of the invention are illustrated by way of example. It is to be expressly understood, however, that the drawings are for the purpose of illustration and description only, and are not intended as a definition of the limits of the invention.

Figure 1:
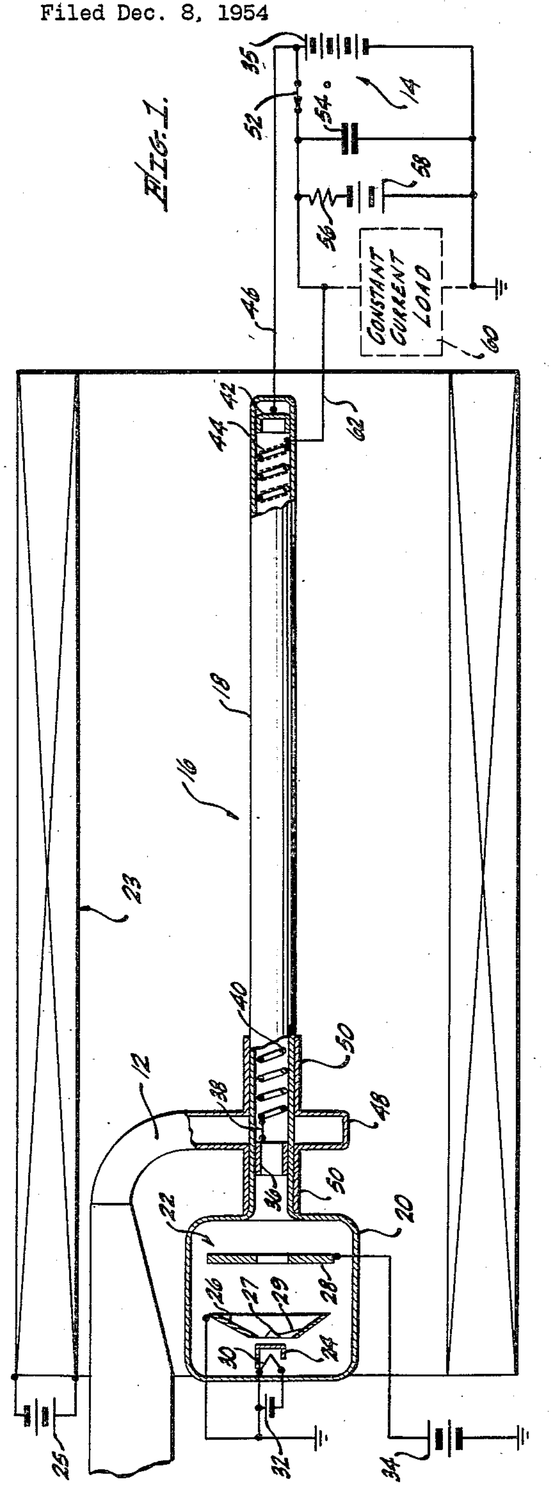
Fig. 1 is a sectional view of a backward-wave oscillator and an associated frequency sweep circuit constructed in accordance with the invention.

Referring to Fig. 1, a backward-wave oscillator is shown having a rectangular output waveguide 12 and a frequency sweep circuit 14. The oscillator comprises a traveling-wave tube 16 having an evacuated envelope 18 with an enlarged portion 20 of the envelope shown at the left in Fig. 1. An electron gun 22 is disposed within the enlarged portion 20 of the envelope 18 for developing an electron stream.

A magnetic solenoid 23 is disposed concentrically about the envelope 18 to focus or confine the stream electrons as the stream is directed along the envelope 18. A unidirectional axial magnetic field is therefore maintained within the envelope 18 by means of the solenoid 23 which is provided with a direct-current voltage supply, e. g. a battery 25.

Electron gun 22 as illustrated in Fig. 1 has a cathode 24, a focusing electrode 26, and an accelerating anode 28. A filament 30, which is provided for cathode 24, is connected across a battery 32. The positive side of filament 30 is also connected to the cathode 24 which is grounded.

Focusing electrode 26 has a frusto-conical configuration with an internal surface of revolution disposed at an angle of 67½ degrees with respect to its axis of revolution. Focusing electrode 26 may be maintained at ground potential as shown in order to focus electrons emitted from cathode 24. A conical focusing element 27 is disposed at the center of focusing electrode 26 to aid in producing a hollow electron stream. To this end conical element 27 is maintained at the center of focusing electrode 26 by means of three wires 29 connected to focusing electrode 26.

Accelerating anode 28, which is an apertured disc-shaped electrode, is maintained at a few hundred volts positive with respect to ground by means of an accelerating source of potential 34.

Shown disposed concentrically within the envelope 18 in the direction of electron flow from the gun 22 are a matching ferrule 36 connected over an antenna lead 38 to a conductive helix 40, and a collector electrode 42, which is positioned at the end of envelope 18 opposite the gun 22 to intercept the stream electrons.

It is desirable to maintain the ratio of the pitch and the diameter of helix 40 constant. Helix 40 is hence generally made of tungsten or molybdenum because of the high moduli or elasticity of those metals.

It is necessary to attenuate signal reflections from the left end of the tube 16 in order to prevent an undesirable type of self-oscillation resulting from subsequent reflections at the right end of helix 40. To this end a lossy material 44 is coated onto or between the last few turns at the right end of the helix 40. The lossy material may consist of any of a number of available commercial products, e. g. that known by the trade name "Aquadag."

Collector electrode 42 is maintained at a positive potential with respect to ground by a connection 46 to the positive terminal of a second accelerating source of potential 35.

Output waveguide 12, which is disposed about envelope 18, has a shorted termination 48 and a conductive sleeve 50, sleeve 50 being disposed coextensive with ferrule 36.

The oscillator of Fig. 1 may be tuned by adjusting the direct-current voltage of the helix 40. The characteristic tuning curve of frequency versus helix voltage is, however, not linear. The special circuit 14 has, therefore, been adopted to sweep the oscillator frequency range linearly with time.

The frequency range of the oscillator is linearly swept by opening a normally closed switch 52 disposed in series between the potential source 35 and three other circuit branches in the sweep circuit 14. The three other circuit branches are shown connected in parallel with potential source 35, viz., a potential storage element or capacitor 54; a resistor 56 and a source of potential 58; and a constant current load 60 representing the impedance from helix 40 to cathode 24, i. e. ground, helix 40 being connected to switch 52 by a lead 62. The polarity of source of potential 58 may be opposite that shown in Fig. 1; however, the polarity shown, i. e. with the positive terminal of potential source 58 connected to ground, is generally preferable in order to preserve a linear frequency sweep with time.

In order to initiate operation of the frequency sweep circuit 14, switch 52 is opened whereupon capacitor 54 discharges through resistor 56 and source of potential 58 and the constant current load 60. As the voltage across the capacitor 54 decreases, the frequency of oscillation of the oscillator is decreased by virtue of the connection 62 from helix 40 to capacitor 54. The decrease in frequency with time may be made substantially linear by appropriately choosing the operating parameters of the circuit 14.

A very accurate expression for the variation of frequency, $f$, with the direct-current helix voltage, V, is as follows:

$$f=\frac{f_0}{1+\left(\dfrac{V_0\left(1+\frac{\omega_q}{\omega}\right)}{V}\right)^{1/2}} \qquad (1)$$

where:

$V_0$ is the voltage necessary to accelerate electrons to a velocity of $c\tan\psi$, $c$ being the velocity of light and $\psi$ being the pitch angle of the helix;

$f_0$ is the frequency for which the circumference of the helix is one free-space wavelength; and $$\frac{\omega_q}{\omega}$$

is a small ratio which is proportional to the square root of the perveance of the electron stream projected through the helix.

The ratio, $$\frac{\omega_q}{\omega}$$

is generally small and changes very little with V, e. g. from 0 to 0.04. Hence, this factor may be neglected altogether in some cases for an allowable error in a linear frequency sweep of as large as one percent. Hence, $$f\approx\frac{f_0}{1+\left(\frac{V_0}{V}\right)^{1/2}} \qquad (2)$$

The current through load 60 may be considered constant for an allowable frequency error as large as two percent. For the adjustment of the parameters in the sweep circuit 14 in considering variations in $$\frac{\omega_q}{\omega}$$

with V and the current, $I_0$, through load 60, a more thorough analysis than that given heretofore may be made; however, as a practical matter this will generally be unnecessary.

The variation of helix voltage V as produced by opening switch 52 in sweep circuit 14 is given by the following equation:

$$V=-(V_1+I_0R)+(V_{max}+I_0R)\epsilon^{\left(\frac{-t}{RC}\right)} \qquad (3)$$

where:

$V_1$ is the voltage of potential source 58;
R is the resistance of resistor 56;
$V_{max}$ is the voltage of accelerating potential source 35;
$t$ is time; and
C is the capacitance of capacitor 54.

Substituting Equation 3 into Equation 2, $f$ may be expressed as a function of $t$. Equation 3 may be expressed in terms of three general factors, e. g. as $$V=-x+y\epsilon^{-zt} \qquad (4)$$

where:

$x=V_1+I_0R$;
$y=V_{max}+I_0R$; and
$z=\frac{1}{RC}$

Figure 3:
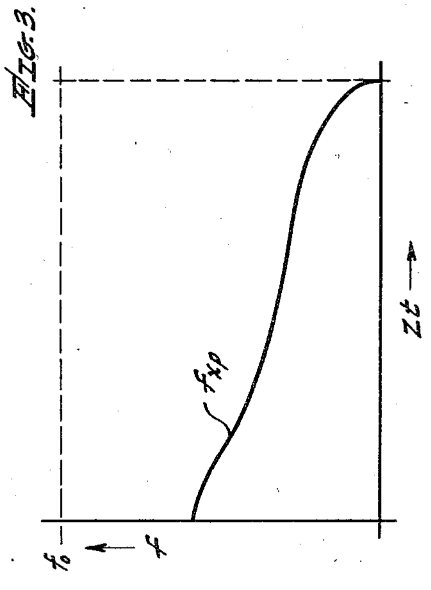
Figs. 3 and 4 are curves of frequency plotted versus time.
Figure 2:
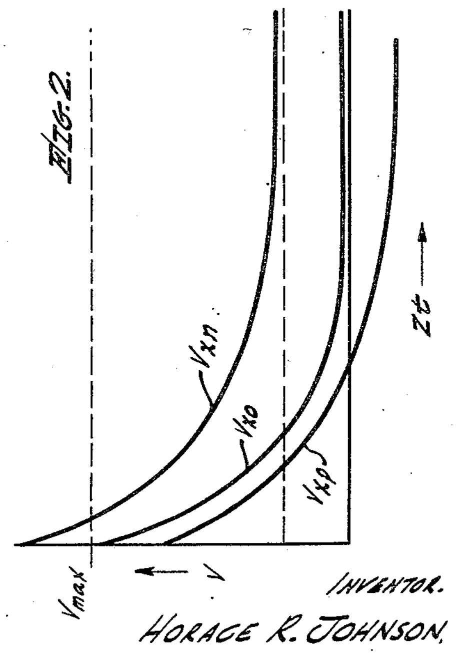
Fig. 2 is a graph showing a group of transient voltage curves, characteristic of the operation of the frequency sweep circuit shown in Fig. 1.
Figure 4:
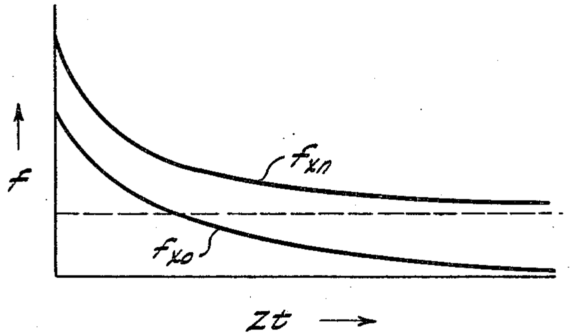

V is plotted in Fig. 2 for a positive value of $x$ indicated by $V=V_{xp}$, for a negative value of $x$ identified by $V=V_{xn}$, and for $x=0$ by $V=V_{x0}$. $f$ may be expressed as a function of $zt$ as $$f=F(zt) \qquad (5)$$

when Equation 4 is substituted into Equation 2. The curve of Equation 5 when $x$, $y$ and $z$ are positive, i. e. when $V=V_{xp}$, $f=f_{xp}$, is plotted in Fig. 3 although its non-linearity is somewhat exaggerated. $x$ is preferably positive to increase linearity. This is evident from Fig. 4 where $f$ is plotted when $x$ is negative, i. e. $f=f_{xn}$, and where $x=0$ where $f=f_{x0}$.

Figure 5:
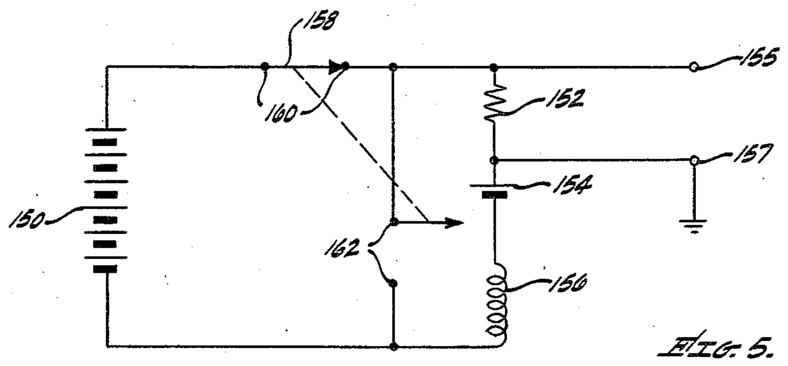
Fig. 5 is an alternative embodiment of the sweep circuit of the invention.

An analogous inductance circuit gives the same type of transient voltage curve as given in Equation 4. This circuit is shown in Fig. 5 where a relatively large battery 150 is shown serially connected with a resistor 152, a relatively small source of potential 154 and a potential storage element or inductor 156. A double-pole, single-throw switch 158 has normally closed contacts 160 connected in series with battery 150 and normally open contacts 162 connected in parallel with battery 150. A suitable transient voltage is derived across the resistor 152 by changing the position of switch 158. This voltage is given by the relationship of Equation 4 where $I_0=0$ and $x=V_{12}$, $y=V_{m2}$ and $$z=\frac{R_2}{L}$$

$V_{12}$ being the voltage of potential source 154, $V_{m2}$ being the voltage of battery 150, $R_2$ being the resistance of resistor 152, and L being the inductance of inductor 156.

$$V=-V_{12}+V_{m2}\epsilon^{\frac{-R_2t}{L}} \qquad (6)$$

For initial operation of the circuit of Fig. 5 a transient voltage is produced by momentarily shorting potential source 154 through normally open contacts 162 and by opening the normally closed contacts 160 of switch 158 whereby potential source 150 is disconnected from the circuit. By shorting serially connected resistor 152, potential source 154 and inductor 156 through contacts 162, a transient voltage is obtained across resistor 152. Helix 40 should therefore be connected to a positive output terminal 155 and another output terminal 157 should be grounded. Inductor 156 resists a decrease in current, and hence the current through resistor 152 and therefore the voltage across it decreases exponentially with time.

To find the optimum values of $x$, $y$ and $z$ in Equation 4, a range of a frequency sweep will first be chosen within the frequency range of the oscillator. $V_0$, $f_0$ and $I_0$ will be determined by the geometry and operating conditions of the tube 16 outside the sweep circuit 14. It will generally be desirable to reclose switch 52 after a time interval less than $$zt=1n\frac{y}{x}$$

for two reasons. First the oscillator will obviously not oscillate down to a frequency $f=0$ where $$zt=1n\frac{y}{x}$$

Furthermore, the frequency error in linearity for optimum operating conditions may be largest near this value of $zt$.

Figure 6:
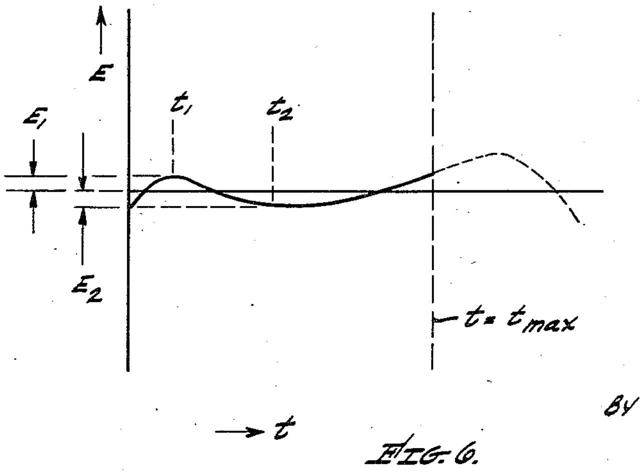
Fig. 6 is a curve of frequency error which exists when the sweep circuit of the present invention is constructed according to a preferred method of design.

In order to make the sweep time interval as long as possible for the least error, the frequency error, E, should be chosen as shown in Fig. 6 where the following equation is plotted as a function of $t$:

$$E=F(zt)-f_{max}+\left(\frac{f_{max}-f_{min}}{t_{max}}\right)t \qquad (7)$$

As stated previously, $f_{max}$ and $f_{min}$, which are the maximum and minimum sweep frequencies, respectively, are chosen to be within the operating band of the tube 16. At $f=f_{min}$, $t=t_{max}$, $t_{max}$, $x$, $y$ and $z$ are then the four variables which must be determined for an optimum linear frequency sweep.

In Fig. 6 E reaches a maximum twice and a minimum once, i. e. a maximum negative value. The magnitude of the positive error at the right of the curve will generally be larger than the other maximum and minimum. This is true because F($zt$) cannot be matched to the linear desired function of frequency except at three points because $f$ is a function of only three of the variable parameters, viz. $x$, $y$ and $z$. It will then be desirable to choose $t_{max}$ also as shown in Fig. 6. To obtain a maximum sweep for a minimum error, $f$ should begin with an error equal to $E_2$ where $E_2$ is the maximum negative error. Likewise the error at $t=t_{max}$ should be equal to $E_1$ which is the maximum positive error shown on the left hand side of Fig. 6. It will generally be desirable to keep both $E_1$ and $E_2$ below a certain standard; therefore, $E_1$ should be equal to $E_2$. By setting $$\frac{dE}{dt}$$

equal to zero and solving for $t$, two roots of $t$ are defined as $t=t_1$ at $E=E_1$ and $t=t_2$ at $E=E_2$. $E_1$ may be found in terms of the four design parameters $t_{max}$, $x$, $y$ and $z$. The above may be mathematically stated in terms of the general expression of error, E, in Equation 7 as follows:

$$[E]_{t=0}=E_2 \qquad (8)$$

$$[E]_{t=t_{max}}=E_1 \qquad (9)$$

$$E_1=E_2 \qquad (10)$$

Using Equations 8, 9, and 10, $E_1$ may be expressed as a function of only a single design parameter, e. g. $E_1=f(x)$. By setting $$\frac{dE_1}{dx}=0$$

to find $x$ for a minimum $E_1$, $x=x_1$ may be determined for the other conditions of a substantially linear frequency sweep. If the value of $x=x_1$, substituted into Equations 6, 7 and 8, gives impractical values of $V_{max}$, $V_1$, R and C in terms of $y$ and $z$, then $x_1$ may be modified accordingly.

The above recited design procedure is somewhat exhaustive and, in a number of cases it will be unnecessary, i. e. numerous other simpler methods may be employed. For example, for some conditions for circuit 14 in Fig. 1, viz.

$$V_1>>I_0R \qquad (11)$$

and $$V_{max}-V_1>>I_0R \qquad (12)$$

$I_0$ may be considered zero. A tube may be employed in which $f_0=7.20\times10^9$ cycles per second and $V_0=2280$ volts. Assuming a reasonable voltage range of V, e. g. from 3500 volts producing a frequency of $3.98\times10^9$ cycles per second to 300 volts producing a frequency of 1.92 to $10^9$ cycles per second, and assuming $$\frac{\omega_q}{\omega}\approx0$$

$x$, $y$ and $z$ may be found if E is set equal to zero at $$t\frac{t_{max}}{2}$$

where $f$ is set equal to the mid-frequency of the operating band of the tube, i. e.

$$[f]_{t=\frac{t_{max}}{2}}=\frac{f_{max}-f_{min}}{2}=2.95\times10^9 \text{ cycles per second} \qquad (13)$$

where $V=1098$ volts.

Equation 3 for $$t=\frac{t_{max}}{2}$$

then becomes $$1098=-V_1+(3500+V_1)\epsilon^{\frac{-zt_{max}}{2}} \qquad (14)$$

And Equation 3 for $t=t_{max}$ becomes $$300=-V_1+(3500+V_1)\epsilon^{-zt_{max}} \qquad (15)$$

Solving Equations 14 and 15 simultaneously $$V_1=97.8 \text{ volts}$$

and $$zt_{max}=2.2022$$

From the relationship of $zt_{max}$, a suitable sweep time, $t_{max}$, may then be chosen for an appropriate resistance-capacitance time constant.

Using the approximations and calculations above, the maximum deviation of frequency from a linear sweep is about 0.14 percent. It is thus obvious that the circuit 14 is extremely useful in producing a linear frequency sweep for the microwave oscillator.

What is claimed is:

1. In a traveling-wave tube backward-wave oscillator having a thermionic cathode for providing a source of electrons and a conductive helix for propagating electromagnetic waves, an electronic tuning circuit for sweeping the oscillation frequency range of the oscillator substantially linearly with time, said circuit comprising a resistor connected between the cathode and the helix of the oscillator, a double-pole single-throw switch, the poles of which having normally closed contacts and normally open contacts respectively, a first source of potential, an inductor, and a second source of potential connected in the order named serially from the helix through said normally closed contacts to the cathode, the positive terminal of said second potential source being connected positive to the cathode, said normally open contacts of said switch being respectively connected between the helix and the negative terminal of said first potential source.

2. In a traveling-wave tube oscillator having a thermionic cathode for providing a source of electrons and a conductive helix for propagating electromagnetic waves, an electronic tuning circuit for sweeping the oscillation frequency range of the oscillator substantially linearly with time, said circuit comprising a first source of potential having a negative terminal connected to the cathode, a normally closed switch connected between the positive terminal of said first source and the helix, a capacitor connected between the helix and the cathode, a resistor and a second source of potential connected serially between the helix and the cathode, the positive terminal of said second source of potential being connected to the cathode, whereby the voltage, $V_0$, of the helix with respect to the cathode varies with time, $t$, in response to opening of said switch as approximately given by the following relationship $$V_0\approx-x+y\epsilon^{-zt}$$

where $x$, $y$, and $z$ are positive constants.

3. In a traveling-wave tube oscillator having a thermionic cathode for providing a source of electrons and a conductive helix for propagating electromagnetic waves, an electronic tuning circuit connected between the cathode and the helix for sweeping the oscillation frequency range of the oscillator substantially linearly with time, said circuit comprising an electrical energy storage element, a first source of voltage, switch means for selectively connecting said first source across said element, a resistive impedance element, a second source of voltage connected in series with said energy storage element, and means for deriving an output potential from said circuit, said sources being connected with a predetermined polarity whereby said output potential decays exponentially with time in response to said opening of switch means from a potential positive with respect to the cathode of the oscillator toward a potential negative with respect to the cathode, whereby the frequency of oscillation of the oscillator decreases substantially linearly with time, said energy storage element, said potential sources, and said resistive impedance element being adjusted to produce an output potential V varying as defined in the equation $V=-x+y\epsilon^{-zt}$, where $x$, $y$, and $z$ are positive constants, $\epsilon$ equals 2.71828, and $t$ is time.

References Cited in the file of this patent

UNITED STATES PATENTS

| | | |
|---|---|---|
| 2,434,293 | Stearns | Jan. 13, 1948 |
| 2,567,286 | Hugenholtz | Sept. 11, 1951 |
| 2,603,773 | Field | July 15, 1952 |
| 2,653,270 | Kompfner | Sept. 22, 1953 |